United States Patent
Ganaha et al.

(10) Patent No.: US 10,302,293 B2
(45) Date of Patent: May 28, 2019

(54) LIGHT SOURCE DEVICE

(71) Applicant: Digital Electronics Corporation, Osaka (JP)

(72) Inventors: Yuji Ganaha, Osaka (JP); Daisuke Nishimatsu, Komaki (JP)

(73) Assignee: SCHNEIDER ELECTRIC JAPAN HOLDINGS LTD., Tokyo (JP)

( * ) Notice: Subject to any disclaimer, the term of this patent is extended or adjusted under 35 U.S.C. 154(b) by 28 days.

(21) Appl. No.: 15/284,741

(22) Filed: Oct. 4, 2016

(65) Prior Publication Data
US 2017/0184295 A1    Jun. 29, 2017

(30) Foreign Application Priority Data

Dec. 25, 2015    (JP) .................................. 2015-253429

(51) Int. Cl.
| | |
|---|---|
| *F21V 25/12* | (2006.01) |
| *F21V 8/00* | (2006.01) |
| *H01L 33/32* | (2010.01) |
| *H01L 33/50* | (2010.01) |
| *H01L 33/62* | (2010.01) |

(Continued)

(52) U.S. Cl.
CPC ............ *F21V 25/12* (2013.01); *C09D 133/14* (2013.01); *G02B 6/0073* (2013.01); *H01L 33/44* (2013.01); *H01L 33/486* (2013.01); *H01L 33/56* (2013.01); *F21Y 2115/10* (2016.08); *H01L 25/0753* (2013.01); *H01L 33/32* (2013.01); *H01L 33/504* (2013.01); *H01L 33/60* (2013.01); *H01L 2933/0025* (2013.01)

(58) Field of Classification Search
CPC ............ F21Y 2115/10; H01L 25/0753; H01L 2933/0025; H01L 33/44; H01L 33/486; H01L 33/56; H01L 33/32; H01L 33/504; H01L 33/60; F21V 25/12; C09D 133/14; G02B 6/0073
See application file for complete search history.

(56) References Cited

U.S. PATENT DOCUMENTS

| | | | | |
|---|---|---|---|---|
| 7,271,229 | B2* | 9/2007 | Okazoe ................ | C07D 317/18 526/242 |
| 8,944,618 | B2* | 2/2015 | Tseng .................. | F21V 7/22 362/184 |
| 2017/0096538 | A1* | 4/2017 | Sasaki .................. | C08J 7/047 |

FOREIGN PATENT DOCUMENTS

| | | |
|---|---|---|
| JP | 2002-108563 | 4/2002 |
| JP | 2014-130963 | 7/2014 |
| JP | 2015-140351 | 8/2015 |

* cited by examiner

*Primary Examiner* — Anh T Mai
*Assistant Examiner* — Arman B Fallahkhair
(74) *Attorney, Agent, or Firm* — Wenderoth, Lind & Ponack, L.L.P.

(57) ABSTRACT

A light source device includes a LED package, a container where the LED package is arranged and that is filled with nitrogen gas, and a fluorine-based coating film applied on a surface of the LED package and covering a light exit surface of the LED package. The LED package includes a LED element, a base board on which the LED element is mounted, a peripheral wall portion surrounding the LED element and extending from the base board, sealing resin disposed in an inner space within the peripheral wall portion such that the LED element is sealed with the sealing resin, and the light exit surface that is a surface of the sealing resin surrounded by the peripheral wall portion. Light from the LED element is exited outside the sealing resin through the light exit surface.

6 Claims, 10 Drawing Sheets

(51) Int. Cl.
 *H01L 33/56* (2010.01)
 *H01L 33/44* (2010.01)
 *H01L 33/48* (2010.01)
 *C09D 133/14* (2006.01)
 *F21Y 115/10* (2016.01)
 *H01L 25/075* (2006.01)
 *H01L 33/60* (2010.01)

LIGHT SOURCE DEVICE

CROSS-REFERENCE TO RELATED APPLICATION

This application claims priority from Japanese Patent Applications No. 2015-253429 filed on Dec. 25, 2015. The entire contents of the priority application are incorporated herein by reference.

TECHNICAL FIELD

The present disclosure relates to a light source device.

BACKGROUND

Explosive atmosphere is generated, if flammable substances such as flammable gas (including vapor generated from flammable liquid) or flammable dust is mixed with air. If an electric device or an electronic device (hereinafter, simply referred to as a device) is used under such explosive atmosphere, explosive gas (flammable dust) may be burned by heat from a high-temperature part of the device or an electric spark generated in the device. Therefore, the device includes an explosion-proof structure so that explosive gas (flammable dust) is not burned even if it is used in the explosive atmosphere.

One example of such an explosion-proof structure of the device may be a pressurized explosion-proof structure. In such a pressurized explosion-proof structure, a main part of the device, which may be an ignition source, is arranged in a certain container (an explosion-proof container). Nonflammable gas (protective gas) such as nitrogen is supplied in the container to keep inner pressure and the container is filled with nonflammable gas. Thus, the ignition source is isolated from the atmosphere outside the container (explosive atmosphere). Nitrogen gas is generally used for the nonflammable gas supplied into the container, since nitrogen gas is easily handled and excellent in chemical stability.

SUMMARY

According to the present technology, the light source device includes a LED package, a container where the LED package is arranged and that is filled with nitrogen gas, and a fluorine-based coating film applied on a surface of the LED package and covering a light exit surface of the LED package. The LED package includes a LED element, a base board on which the LED element is mounted, a peripheral wall portion surrounding the LED element and extending from the base board, sealing resin disposed in an inner space within the peripheral wall portion such that the LED element is sealed with the sealing resin, and the light exit surface that is a surface of the sealing resin surrounded by the peripheral wall portion. Light from the LED element is exited outside the sealing resin through the light exit surface.

DETAILED DESCRIPTION

A device that is used in nitrogen gas atmosphere such as a pressurized explosion-proof type device may include light emitting diodes (LEDs) as a light source. In such a configuration, luminance of LED elements included in a LED package is gradually degraded as the lighting time elapses.

The present invention was made to solve the above described problems and to achieve the following object. An object of the present invention is to provide a light source device where luminance of LED elements is less likely to be degraded.

The present inventors found reasons of degradation in luminance of LED elements. In the light source device including an LED package as a light source, if the LED package is continuously lighted on with the device being filled with nitrogen gas, a nitrogen component derived from nitrogen gas that is inert gas is adhered on a light emitting surface of the LED element in the LED package as time elapses and the light emitting surface of the LED element is blackened by the nitrogen component. The present inventors found that the blackening of the light emitting surface degrades luminance of the LED element.

The present inventors made earnest investigation to achieve the above object and found that a certain fluorine-based coating film applied on a light exit surface of the LED package causes less blackening of the light emitting surface of the LED element.

Figure 1:
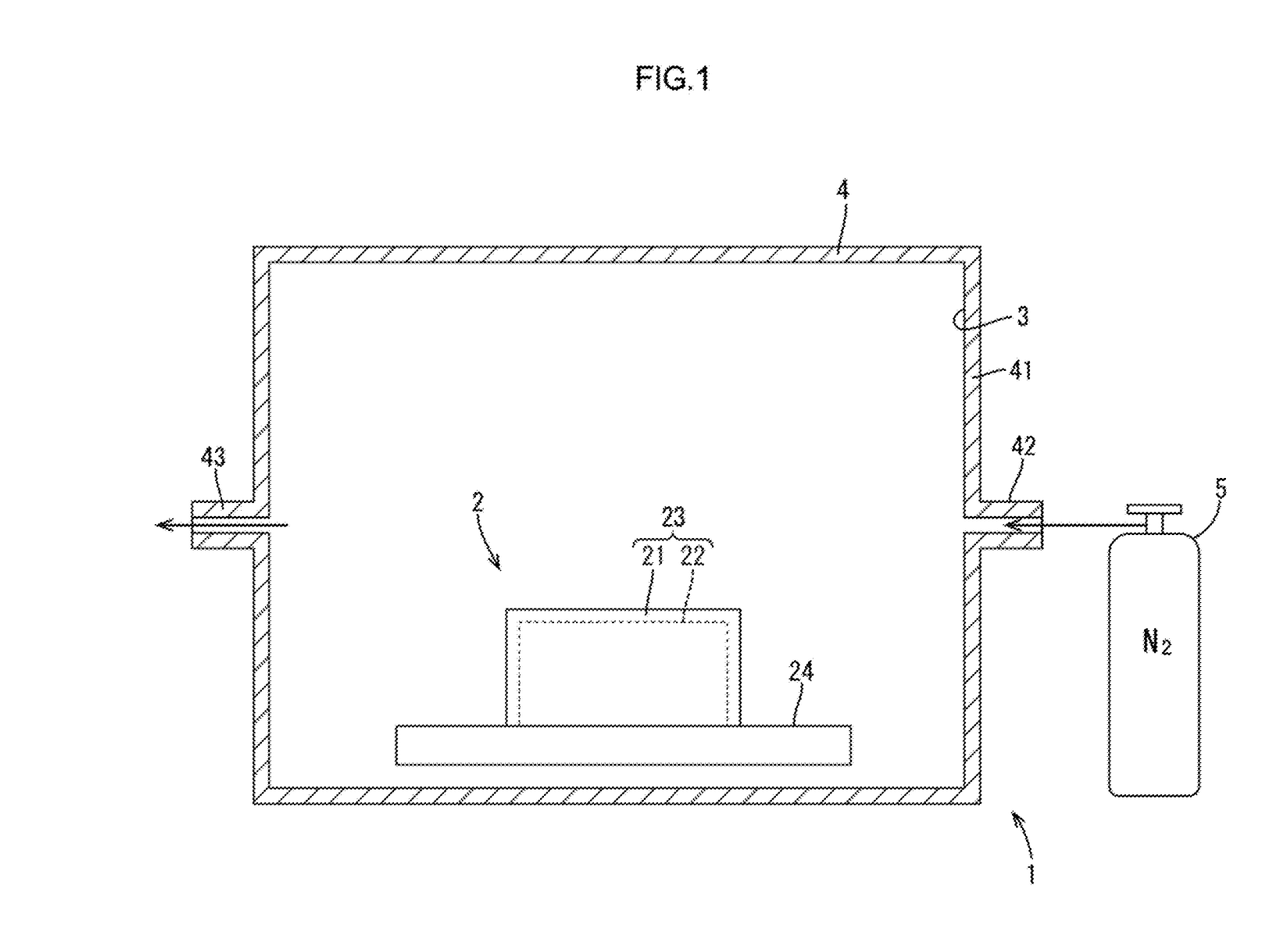
FIG. 1 is a schematic view of a light source device according to one embodiment.

Hereinafter, a light source device according to one embodiment of the present technology will be described with reference to FIGS. 1 to 3. FIG. 1 is a schematic view of a light source device 1 according to one embodiment. The light source device 1 is a pressurized explosion-proof type device that uses nitrogen as inert gas (protection gas). The light source device 1 includes a light source unit 2, a casing 4 including a container 3 that is filled with nitrogen gas, and a supply part 5 that supplies nitrogen gas into the container 3. The light source device 1 further includes devices other than the light source unit 2, for example, includes a relay device, wiring, and a circuit board. Such devices and the light unit 22 are arranged in the container 3 of the casing 4.

The light source unit 2 includes a LED package 22 having a fluorine-based coating film 21 (hereinafter, may be referred to as a film applied LED package 23) and a LED board 24 where the film applied LED package 23 is mounted.

Figure 2:
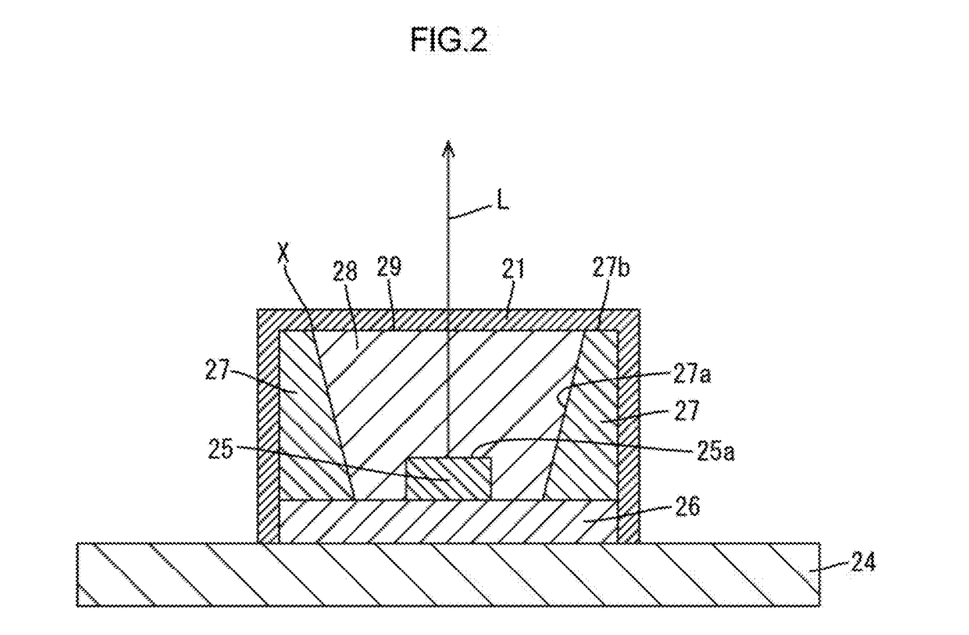
FIG. 2 is a cross-sectional view of a light source unit.

FIG. 2 is a cross-sectional view typically illustrating the light source unit 2. The LED package 22 is a top-surface light emitting type LED package that emits white light. The LED package 22 mainly includes a LED element 25, a base board 26 where the LED element 25 is mounted, a peripheral wall portion 27, sealing resin 28, and a light exit surface 29. The peripheral wall portion 27 extends from the base board 26 and surrounds the LED element 25. The peripheral wall portion 27 extends in a light exit direction that light from the LED element 25 emits (an optical axis direction) and has an extended edge that forms an opening. The LED element 25 is arranged inside the peripheral wall portion 27. The base board 26 and the peripheral wall portion 27 forms an inner space therein and the inner space is filled with the sealing resin 28 to enclose the LED element 25 therein. The sealing resin 28 has a surface opposite from the base board 26 where the LED element 25 is mounted and the surface is the light exit surface 29. Light emitted from the LED element 25 travels through the sealing resin 28 and exits the LED package 22 through the light exit surface 29.

The LED element 25 includes a gallium nitride (GaN) base semiconductor and generates blue light or green light. The LED element 25 includes, for example, a transparent insulating substrate such as a sapphire substrate, an n-type gallium nitride layer, an active layer, and p-type gallium nitride layer, and the substrate and the layers are layered on the insulating substrate in this order. The LED element 25 further includes a transparent conductive film made of Indium Tin Oxide (ITO) and a protection film made of SiO2 on the layered object, if necessary.

The LED element 25 has a substantially rectangular parallelepiped outer shape and has one surface facing the base board 26 and another surface opposite to the one surface. The other surface of the LED element 25 is a light emitting surface 25a. In FIG. 2, the LED element 25 has the light emitting surface 25a facing upward, and light emitted by the LED element 25 through the light emitting surface 25a has an optical axis L. In this embodiment, the optical axis L of the LED element 25 is vertical to a surface (a mount surface) of the LED board 24.

The peripheral wall portion 27 has a tubular shape surrounding the LED element 25. The peripheral wall portion 27 extends from the surface of the base board 26 with surrounding the LED element 25. The peripheral wall portion 27 is a molded object made of white resin, for example. The peripheral wall portion 27 has an inner surface 27a surrounding the LED element 25 and the inner surface 27a is a light reflecting surface (a reflector). The peripheral wall portion 27 has an end surface 27b that is opposite to the base board 26. The peripheral wall portion 27 has an inner diameter and the inner diameter is increased as is closer to the end surface 27b from the base board 26. The inner surface 27a is a reversed tapered surface.

The sealing resin 28 is silicone resin, for example, and the inner space inside the peripheral wall portion 27 is filled with the sealing resin 28. The LED element 25 is covered with the sealing resin 28 inside the peripheral wall portion 27 and enclosed in the sealing resin 28. In this embodiment, phosphors (not illustrated) are dispersed within the sealing resin 28. The phosphors absorb light emitted by the LED element 25 and emit light having a wavelength different from a wavelength of the light emitted by the LED element 25. Specifically, the phosphors include green phosphors that absorb light (blue light) emitted by the LED element 25 and emit green light, and red phosphors that absorb the light (blue light) emitted by the LED element 25 and emit red light.

Figure 3:
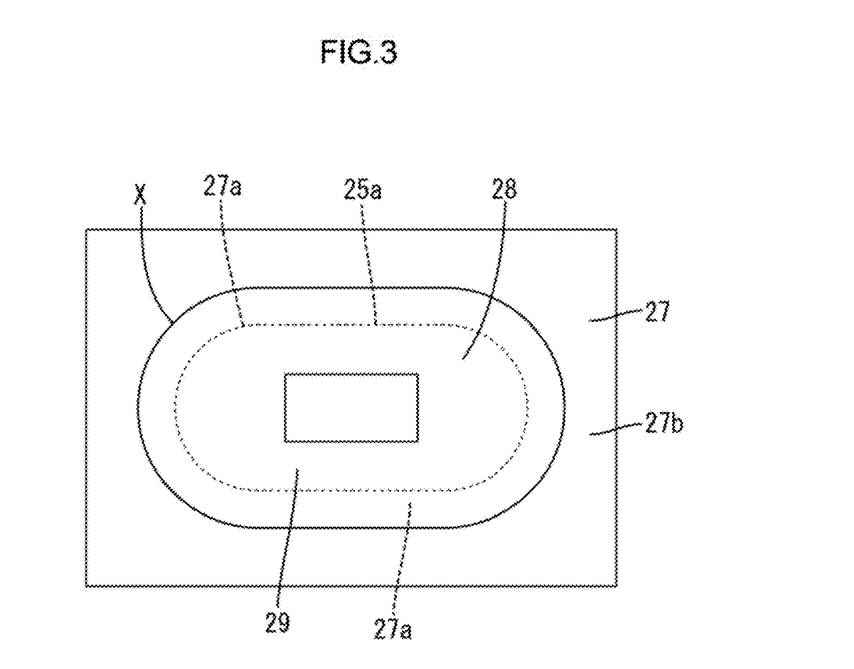
FIG. 3 is a plan view of an LED package.

FIG. 3 is a plan view of the LED package 22. As illustrated in FIGS. 2 and 3, a surface of the sealing resin 28 is on a same plane as the end surface 27b of the peripheral wall portion 27 and the surface of the sealing resin 28 is the light exit surface 29. The light emitted by the LED element 25 exits the sealing resin 28 through the light exit surface 29. In this embodiment, as illustrated in FIG. 3, the light exit surface 29 has a shape obtained by replacing short sides of a rectangle with arches. The light exit surface has an outer peripheral edge that is in contact with an inner peripheral edge of the end surface of the peripheral wall portion 27. In FIGS. 2 and 3, a border (a contact portion) of the outer peripheral edge of the light exit surface 29 and the inner peripheral edge of the end surface 27b is illustrated by X.

The fluorine-based coating film 21 is applied on the surface of the LED package 22 to cover the light exit surface 29. In this embodiment, as illustrated in FIG. 2, the fluorine-based coating film 21 is applied on a top surface of the LED package 22 including the light exit surface 29 and also on four side surfaces of the LED package 22. The top surface of the LED package 22 includes the light exit surface 29 and the end surface 27b of the peripheral wall portion 27.

The fluorine-based coating film 21 protects the light emitting surface 25a of the LED element 25 included in the LED package 22 so that a film of a nitrogen component derived from nitrogen gas is not formed on the light emitting surface 25a. Very minute gaps may be generated at the border portion X between the outer peripheral edge of the light exit surface 29 and the inner peripheral edge of the end surface 27b and gas may be passed through the very minute gaps. The fluorine-based coating film 21 preferably covers an entire surface area of the light exit surface 29 and the end surface 27b so as to close the very minute gaps. The luminance of the LED element 25 included in the LED package 22 is less likely to be degraded by applying the fluorine-based coating film 21 as described above.

The fluorine-based coating film 21 that is applied on the surface of the LED package 22 (such as the light exit surface 29) has a thickness and the thickness is not limited as far as the object of the present technology is achieved but may be preferably 1 μm or more and more preferably 2 μm or more. The thickness of the fluorine-based coating film 21 is preferably 45 μm or less, and more preferably 40 μm or less. With the fluorine-based coating film 21 having a thickness within such a range, the LED element 25 of the LED package 22 is less likely to be blackened by nitrogen gas, and luminance of light from the LED package 22 is less likely to be degraded. Namely, luminance of light is less likely to be degraded by nitrogen gas and luminance of light is less likely to be degraded due to a film thickness of the fluorine-based coating film 21.

The fluorine-based coating film 21 may be applied on the surface of the LED package 22 such as the light exit surface 29 with any method as long as the object of the present technology is achieved and any one of known methods may be selected as appropriate. In one example of the known methods, liquid fluorine-based coating agent for forming the fluorine-based coating film 21 is coated on the surface of the LED package 22, and the coated object is dried and the fluorine-based coating film 21 is formed.

Any methods of coating the fluorine-based coating agent may be used and known methods such as a dispenser coating method, a dip coating method, a brush coating method, a spray coating method, a roll coating method, and printing may be applied.

In this embodiment, the fluorine-based coating film 21 is applied on the top surface of the LED package 22 but also on the side surfaces of the LED package 22. Therefore, a distance from an end of the fluorine-based coating film 21 near the LED board 24 to the border portion X is greater compared to the configuration that the fluorine-based coating film is applied only on the top surface of the LED package 22. As a result, leaking of nitrogen gas into the LED package 22 is much less likely to occur. Detailed composition of the fluorine-based coating film 21 will be described later.

The LED board 24 includes an elongated support board, and an insulation film, a tracing pattern made of copper foil, and a protection layer that are formed on the support board. The tracing pattern on the LED board 24 is electrically connected to an electrode (not illustrated) of the LED package 22 and receives electric power from external devices and supplies the electric power to the LED package 22. The LED package 22 of the light source unit 2 is turned on or off by control of a controller (not illustrated).

The casing (an explosion-proof container) 4 is made by assembling a box with plastic plates or metal plates. The casing 4 has the container 3 therein surrounded by an inner wall surface of the casing 4 and the light source unit 2 is arranged in the container 3. The light source unit 2 is fixed to a wall surface of the container 3 with fixing means, which is not illustrated in the drawing. Similarly, devices (not illustrated) other than the light source unit 2 are fixed and arranged in the container 3.

The casing 4 includes a wall 41 and the wall 41 has a supply inlet 42 and a discharge outlet 43. Nitrogen gas is supplied from the supply part 5 arranged outside the casing 4 into the container 3 of the casing 4 through the supply inlet 42. Gas such as nitrogen gas is discharged from the container 3 to the outside of the container 3 (outside of the casing 4) through the discharge outlet 43. With the supply inlet 42 and the discharge outlet 43 being closed, an inner space within the casing 4 (the container 3) is a sealed space that is blocked from external air.

The supply part 5 includes a nitrogen cylinder and a supply tube (a hose) that connects the nitrogen cylinder and the supply inlet 42. If an open/close valve of the nitrogen cylinder is adjusted, liquid nitrogen filled in the nitrogen cylinder is decompressed and vaporized. The vaporized nitrogen is jetted from the nitrogen cylinder and further passed through the supply tube and supplied into the container 3 through the supply inlet 42.

The discharge outlet 43 is communicated with external air and gas such as nitrogen gas within the container 3 is discharged outside the container 3 (the casing 4). An adjusting valve (not illustrated) that controls a flow amount (pressure) of discharge gas is arranged in the discharge outlet 43. The adjusting valve is adjusted to control the pressure within the container 3 to higher than atmospheric pressure.

Next, the fluorine-based coating film 21 will be described in detail. The fluorine-based coating film 21 may be made of any components as long as a film of nitrogen component derived from nitrogen gas is less likely to be formed on the light emitting surface 25a of the LED element 25. The fluorine-based coating agent obtained as follows may be preferably used for the fluorine-based coating film 21. A monomer composition containing methacrylic acid ester represented by a following general formula (1) in 49% by mass or more and 74% by mass or less, alkyl(meth)acrylate represented by a following general formula (2) in 16% by mass or more and 31% by mass or less, and fluorine-containing monomer represented by a following general formula (3) in 1% by mass or more and 33% by mass or less is polymerized at random, and fluorine-based random copolymer having the number-average molecular weight in the range of 20,000 to 100,000 is obtained. The obtained fluorine-based random copolymer is dissolved in a solvent including one or more selected from hydrofluorocarbon with a carbon number of 4 to 8 and hydrofluoroether with a carbon number of 4 to 8. Thus, the fluorine-based coating agent is obtained.

(1)

(In the formula, $R_1$ is a linear or branched chain alkyl group with a carbon number of 1 to 3.)

(2)

(In the formula, $R_2$ is hydrogen or a methyl group, $R_3$ is a linear or branched chain alkyl group with a carbon number of 4 to 8.)

(3)

(In the formula, $R_4$ is hydrogen or methyl group, n represents an integral number of 4 to 6.)

The fluorine-based copolymer contained in the fluorine-based coating agent will be described. The fluorine-based copolymer is obtained by polymerizing the monomer composition at random, and the monomer composition contains methacrylic acid ester represented by the general formula (1), alkyl(meth)acrylate represented by the general formula (2), and fluorine-containing monomer represented by the general formula (3).

In the formula (1), $R_1$ is a linear or branched chain alkyl group with a carbon number of 1 to 3 and may be a methyl group, an ethyl group, and propyl group. Methacrylic acid esters (methacrylate) represented by the formula (1) may include methyl methacrylate, ethyl methacrylate, and propyl methacrylate. The compounds can be used alone or in combination of two or more kinds. Methacrylic acid esters represented by the formula (1) may preferably include one or more selected from methyl methacrylate and n-propyl methacrylate.

In the formula (2), $R_2$ is hydrogen or a methyl group, and $R_3$ is a linear or branched chain alkyl group with a carbon number of 4 to 8 and may be a n-butyl group, a iso-butyl group, a tert-butyl group, a pentyl group, a hexyl group, a heptyl group, and an octyl group such as a 2-ethylhexyl group. Examples of the alkyl(meth)acrylates (methacrylate, acrylate) represented by the formula (2) include n-butyl (meth)acrylates, tert(meth)acrylates, isobutyl(meth)acrylates, pentyl(meth)acrylates, hexyl(meth)acrylates, heptyl (meth)acrylates, 2-ethylhexyl(meth)acrylates. The alkyl (meth)acrylates can be used alone or in combination of two or more kinds. The alkyl(meth)acrylates represented by the formula (2) preferably include one or more selected from 2-ethylhexyl(meth)acrylates and n-butyl acrylates. In this specification, (meth)acrylates include methacrylate and acrylate.

In the formula (3), $R_4$ is hydrogen or methyl group, and n represents an integral number of 4 to 6. Examples of the fluorine-containing monomer represented by the general formula (3) include (perfluorohexyl)ethyl(meth)acrylates and (perfluorobutyl)ethyl(meth)acrylates. The fluorine-containing monomer can be used in alone or in combination of two or more kinds.

The fluorine-based copolymer is produced with a following method. The methacrylic acid esters represented by the formula (1), the alkyl(meth)acrylates represented by the formula (2), the monomer composition containing the fluorine-containing monomer represented by the general formula (3), a polymerization solvent, and a polymerization initiator such as 2,2'-azobisisobutyronitrile are mixed and polymerized with a known polymerization method. Thus, the fluorine-based copolymer is obtained.

Another monomer may be copolymerized in addition to the monomers represented by the formulae (1) to (3) as long as the object of the present technology is achieved. For example, functional group containing monomers containing a polar functional group such as a carboxyl group, a hydroxyl group, a glycidyl group, an amide group, and an alkoxysilyl group may be copolymerized to provide functional properties. Specifically, examples of the functional group containing monomers include a silane coupling agent such as γ-methacryloxypropyl trimethoxy silane containing the alkoxysilyl group, methacrylic acid containing a carboxyl group, acrylic acid, glycidyl (meth)acrylate containing a glycidyl group, and hydroxyethyl(meth)acrylate containing a hydroxyl group. The functional group containing monomers can be used in alone or in combination of two or more kinds.

Examples of the polymerization method include solution polymerization, emulsion polymerization, and bulk polymerization. For example, with the solution polymerization, each monomer composition is dissolved in a solvent with desired monomer compositions and a radical polymerization initiator is added thereto and stirred with being heated in a nitrogen atmosphere. Thus, the fluorine copolymer is obtained.

The solvents used in the polymerization may be any solvents as long as the monomer composition is dissolved or suspended. Examples of the solvents include water or organic solvents such as toluene, xylene, heptane, cyclohexane, and tetrahydrofuran. The solvents can be used in alone or in combination of two or more kinds.

The polymerization initiator is not particularly limited as long as it can initiate radical polymerization. Examples of the polymerization initiators include peroxide such as benzoyl peroxide, azo-based compounds such as azobisisobutyronitrile and 2,2'-azobis(isobutyric acid)dimethyl, and persulfate-based polymerization initiators such as potassium persulfate, and ammonium persulfate.

Polymerization time is not particularly limited but may be generally from two hours to twenty four hours. The polymerization time is preferably one day to obtain copolymer having relatively high molecular amount. If the reaction time is too short, unreacted monomers may be remained and the molecular amount may be relatively low. The number-average molecular weight (Mn) of the fluorine-based copolymer may be in the range of 20,000 to 100,000 in terms of polymethyl methacrylate (PMMA). The glass transition temperature of the fluorine-based copolymer is preferably from 0° C. to 50° C.

The methacrylic acid esters represented by the formula (1) is included in 49% by mass or more and 74% by mass or less based on the total mass of the monomer composition. The alkyl(meth)acrylates represented by the formula (2) is included in 16% by mass or more and 31% by mass or less based on the total mass of the monomer composition. The fluorine-containing monomer represented by the general formula (3) is included in 1% by mass or more and 33% by mass or less based on the total mass of the monomer composition.

The fluorine-based random copolymer is dissolved in a solvent including one or more selected from hydrofluorocarbon with a carbon number of 4 to 8 and hydrofluoroether with a carbon number of 4 to 8, and the fluorine-based coating agent is obtained.

Examples of the hydrofluorocarbon with a carbon number of 4 to 8 may include following compounds.

(4)

(5)

Examples of the hydrofluoroether with a carbon number of 4 to 8 may include following compounds.

(6)

(7)

The compound (2,2,2-trifluoroethyl 1,1,2,2-tetrafluoroethyl ether) represented by the formula (7) is preferable because it is not solidified at the temperature of −20° C. The compound represented by the formula (7) is preferably contained in the solvent in 10% by mass or more based on the total mass of the solvent.

The fluorine-based coating agent may include various additives such as antioxidants, ultraviolet stabilizers, and fillers as long as the object of the present technology is achieved.

In forming the fluorine-based coating film, after the fluorine-based coating agent is coated on the light exit surface of the LED package, the coated film may be dried at normal temperature or may be heated so that the LED package is not damaged.

As described before, the light source device 1 includes the fluorine-based coating film 21 that covers the light exit surface 29 of the LED package 22. Therefore, a nitrogen compound is less likely to be generated from nitrogen gas and the light emitting surface 25a is less likely to be blackened. Thus, luminance of light through the light emitting surface 25a is less likely to be degraded.

In the light source device 1 of this embodiment, a part or a whole of the wall 41 of the casing 4 may be a transmissive member having light transmission properties. Examples of the transmissive member include a glass plate, a transparent plastic plate such as an acrylic plate, a display screen using light from a liquid crystal panel. With such a configuration, light from the film applied LED package 23 is transmitted from the container 3 through the transmissive member and exited to the outside of the casing 4.

According to the present technology, the light source device includes a LED package, a container where the LED package is arranged and that is filled with nitrogen gas, and a fluorine-based coating film applied on a surface of the LED package and covering a light exit surface of the LED package. The LED package includes a LED element, a base board on which the LED element is mounted, a peripheral wall portion surrounding the LED element and extending from the base board, sealing resin disposed in an inner space within the peripheral wall portion such that the LED element is sealed with the sealing resin, and the light exit surface that is a surface of the sealing resin surrounded by the peripheral wall portion. Light from the LED element is exited outside the sealing resin through the light exit surface.

In the light source device, the fluorine-based coating film may be made of coating agent that is obtained as follows: a monomer composition containing methacrylic acid ester represented by a following general formula (1) in 49% by mass or more and 74% by mass or less, alkyl(meth)acrylate represented by a following general formula (2) in 16% by mass or more and 31% by mass or less, and fluorine-containing monomer represented by a following general formula (3) in 1% by mass or more and 33% by mass or less is polymerized at random, and fluorine-based copolymer having the number-average molecular weight in the range of 20,000 to 100,000 is obtained, and the obtained fluorine-based copolymer is dissolved in a solvent including one or more selected from hydrofluorocarbon with a carbon number of 4 to 8 and hydrofluoroether with a carbon number of 4 to 8.

Formula (1)

(1)

(In the formula, $R_1$ is a linear or branched chain alkyl group with a carbon number of 1 to 3.)

Formula (2)

(2)

(In the formula, $R_2$ is hydrogen or a methyl group, $R_3$ is a linear or branched chain alkyl group with a carbon number of 4 to 8.)

Formula (3)

(3)

(In the formula, $R_4$ is hydrogen or methyl group, n represents an integral number of 4 to 6.)

In the above light source device, the fluorine-based coating film may have thickness of 1 μm or more.

In the above light source device, the LED package may include phosphors that are dispersed in the sealing resin and absorb light from the LED element and emit light having a wavelength different from a wavelength of the light from the LED element.

In the above light source device, the LED element may include a gallium nitride base semiconductor.

The above light source device may further include a supply part supplying nitrogen gas into the container.

The above light source device may further include a transmissive member that is disposed in a wall surface of the container and through which light from the LED package is passed from the container to outside.

In the above light source device, the transmissive member may be a display screen that uses light from the LED package.

According to the present technology, a light source device where luminance of light from the LED element is less likely to be degraded is provided.

EXAMPLE

Hereinafter, the present technology will be described based on Example. The present technology is not limited to Example.

Example 1

(Production of Fluorine-Based Coating Film)

68 g of methyl methacrylate, 3.5 g of n-butyl acrylate, 24 g of 2-ethylhexyl acrylate, 4 g of (perfluorobutyl)ethyl (meth)acrylates, 0.5 g of methacrylic acid, 150 g of 1,1,2,3,3,4-heptafluorocyclopentane ("ZEORORA H" made by Zeon Corporation), and 0.1 g of 2,2'-azobisisobutyronitrile (AIBN) as the polymerization initiator were put in a glass flask of 500 ml capacity. An agitating blade, a cover, a cooling pipe, and a thermometer were set on the flask and the objects in the flask were agitated at a rotation speed of 100 rpm. Next, the gas inside the flask was replaced with nitrogen for thirty minutes and hot water was added thereto and a heater is set to 80° C. and polymerization was started. After two hours from the starting of the polymerization, 0.1 g of dimethyl-2,2'-azobis(isobutylate) was dissolved in 1 g of ZEORORA H and added to the polymerized liquid and the polymerization was continued for three hours. After completion of the polymerization, the object was cooled down to 40° C. and 650 g of ZEORORA H and 1100 g, of AE-3000 (the compound represented by the formula (7) made by Asahi Glass Co., LTD.) were added thereto and agitated. Thus, the fluorine-based coating agent was obtained.

The above-obtained fluorine-based coating agent was put in an aluminum cup of 1 g capacity and heated at 150° C. for one hour. Then, the solvent was removed and a polymer (random polymer) was obtained. The polymer was measured with Gel Permeation Chromatography (GPC) and the number-average molecular weight (Mn) of the polymer was 45,000 and the weight-average molecular weight (Mw) of the polymer was 123,000 in terms of polymethyl methacrylate (PMMA).

(Production of Film Applied LED Package)

Figure 4:
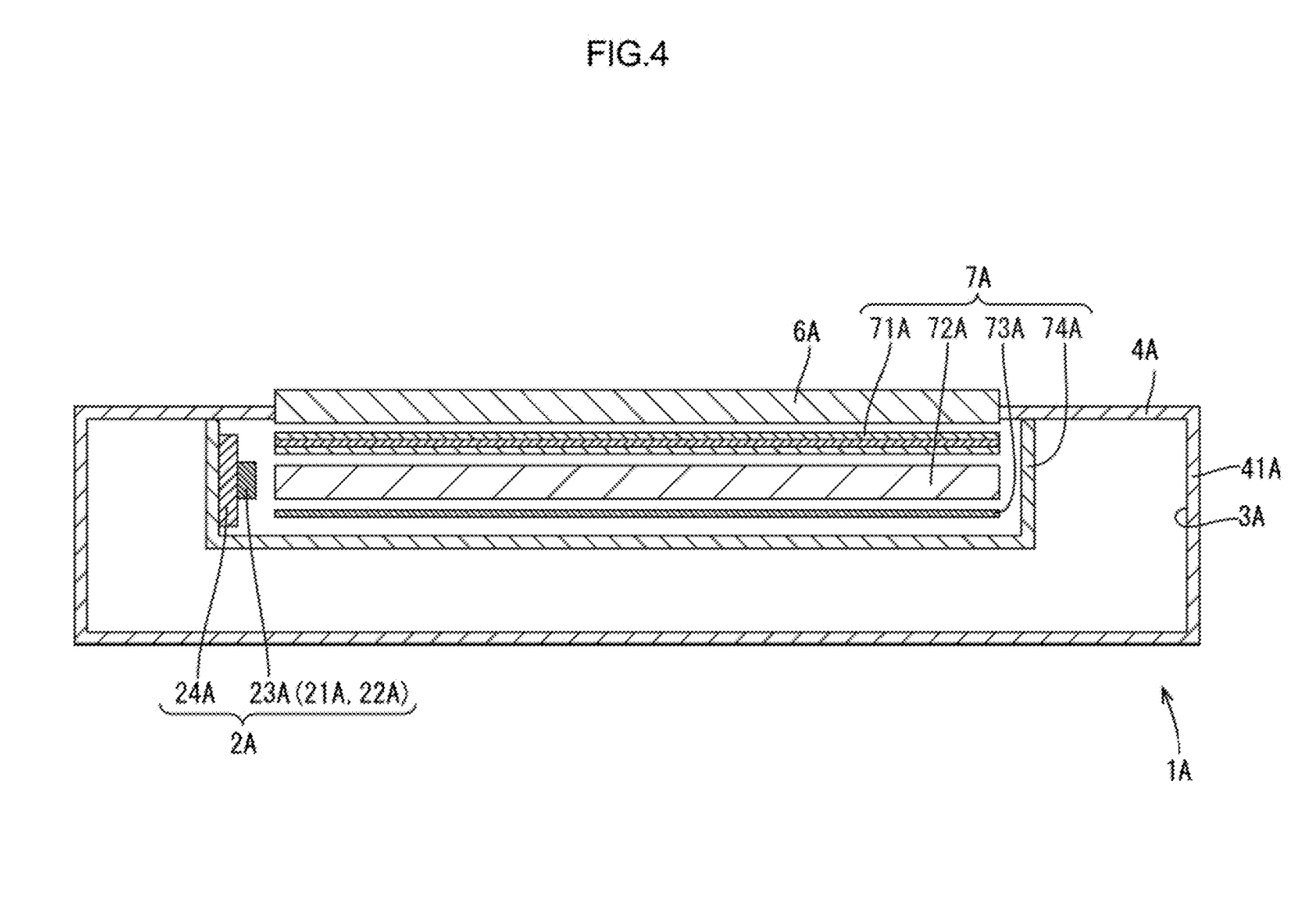
FIG. 4 is a cross-sectional view typically illustrating a configuration of the light source device.

A light source device 1A including a liquid crystal panel (screen size: 12 inches, an example of the display screen) 6A is prepared. FIG. 4 is a cross-sectional view typically illustrating a configuration of the light source device 1A. The light source device 1A includes an edge-light type backlight device 7A in a container 3A within a casing (explosion-proof container) 4A. The backlight device 7A supplies light to the liquid crystal panel 6A. Such a backlight device 7A includes LED packages 22A having a fluorine-based coating film 21A made of the above fluorine-based coating agent (namely, film applied LED packages 23A).

"NS series" (made by NICHIA CORPORATION) that emit white light were used as the LED packages 22A. The LED package 22A includes a blue LED element containing gallium nitride and certain phosphors are added in the sealing resin. The certain phosphors include a green phosphor that converts the wavelength of blue light to that of green light and a red phosphor that converts the wavelength of blue light to that of red light.

The LED packages 22A are arranged in a line on an elongated LED board 24A at equal intervals and the LED packages 22A are electrically connected to each other in series. An LED board 24A including the LED packages 22A thereon (a light source unit 2A) is fixed in a box-shaped chassis 74 of the backlight device 7A. The backlight device 7A further includes a reflection sheet 73A, a light guide plate 72A, and optical sheets 71A that are layered on each other in the chassis 74A. The LED package 22A (the film applied LED package 23A) is fixed. In the chassis 74 such that a light exit surface faces an edge surface of the light guide plate 72A.

The wall 41A of the casing 4A has an opening and the liquid crystal panel 6A is fit in the opening. The liquid crystal panel 6A is an example of the transmissive member having light transmission properties and also an example of the display screen that displays information such as characters, symbols, and images with using light.

The fluorine-based coating film 21 is formed on the surface of the LED package 22A including the light exit surface, and the LED package 22A. Is mounted on the LED board 24A of the light source unit 2A. The fluorine-based film 21A is applied on a surface of each of the LED packages 22A that are mounted on the LED board 24A. Specifically, the fluorine-base coating film 21 is applied to cover the light exit surface of each of the LED packages 22. Thus, the film applied LED package 23A is obtained and the light source unit 2A including the film applied LED package 23A is mounted in the casing 4A, and the backlight device 7A and the liquid crystal panel 6A are mounted in the casing 4A.

Entire areas of exposed surfaces of each LED package 22A are covered with the fluorine-based coating films 21. The fluorine-based coating film 21 applied on each LED package 22A has a thickness of 10 μm.

In forming the fluorine-based coating film 21A, the above-described fluorine-based coating agent is applied on the surface (including the light exit surface) of the fluorine-based coating film 21A with using a dispenser. After the application of the fluorine-based coating agent, the object is dried at a room temperature (23° C.) and the fluorine-based coating film 21 is formed on the surface of the LED package 22A.

(Illumination Degradation Test of Light Source Device 1A)

Figure 5:
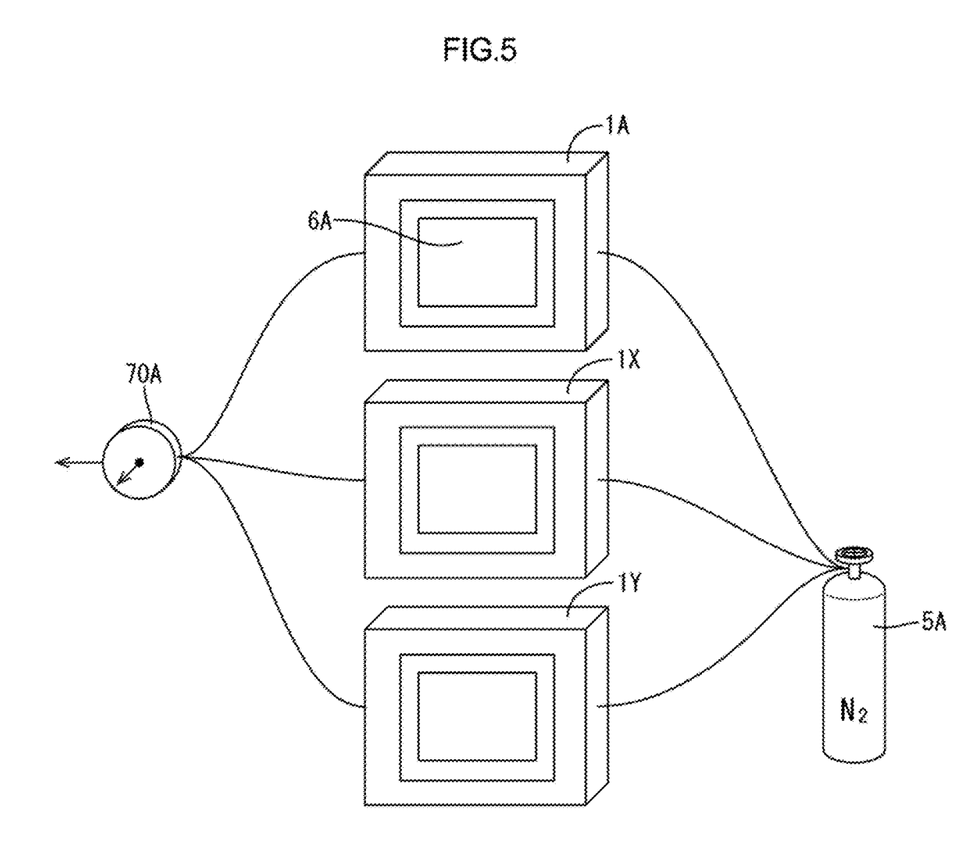
FIG. 5 is a perspective view typically illustrating the light source device that is subjected to a luminance degradation test.

The light source device 1A (the container 3A) is filled with nitrogen gas and each of the LED packages 22A was lighted on with highest luminance. With such a condition, luminance in middle of the screen of the liquid crystal panel 6A was measured every predetermined time and degradation in luminance of the light source device 1A over time was checked. The luminance degradation test was executed at a room temperature (23° C.). FIG. 5 is a perspective view typically illustrating the light source device 1A that is subjected to the luminance degradation test.

As illustrated in FIG. 5, the container 3A of the light source device 1A is filled with nitrogen gas from the supply part 5A including a nitrogen cylinder. The nitrogen cylinder is connected to the container 3A of the light source device 1A via a rubber hose and nitrogen gas injected from the nitrogen cylinder is supplied, into the light source device 1A through the rubber hose. The light source device 1A includes a supply inlet, which is not illustrated, and one end of the rubber hose is connected to the supply inlet. Another end of the rubber hose is connected to an open/close valve included in the nitrogen cylinder.

Nitrogen gas supplied into the container 3A is discharged through a discharge outlet, which is not illustrated, and atmosphere in the container 3A is opened and pressure therein is adjusted. Pressure of gas discharged from the container 3A is adjusted with using a pressure adjustment valve 70A so that the pressure within the container 3 is 300 hPa (atmospheric pressure+300 hPa.). The pressure adjustment valve 70A is connected to the discharge outlet of the light source device 1A via a rubber hose and nitrogen gas discharged from the container 3A is supplied to the pressure adjustment valve 70A through the rubber hose.

Figure 6:
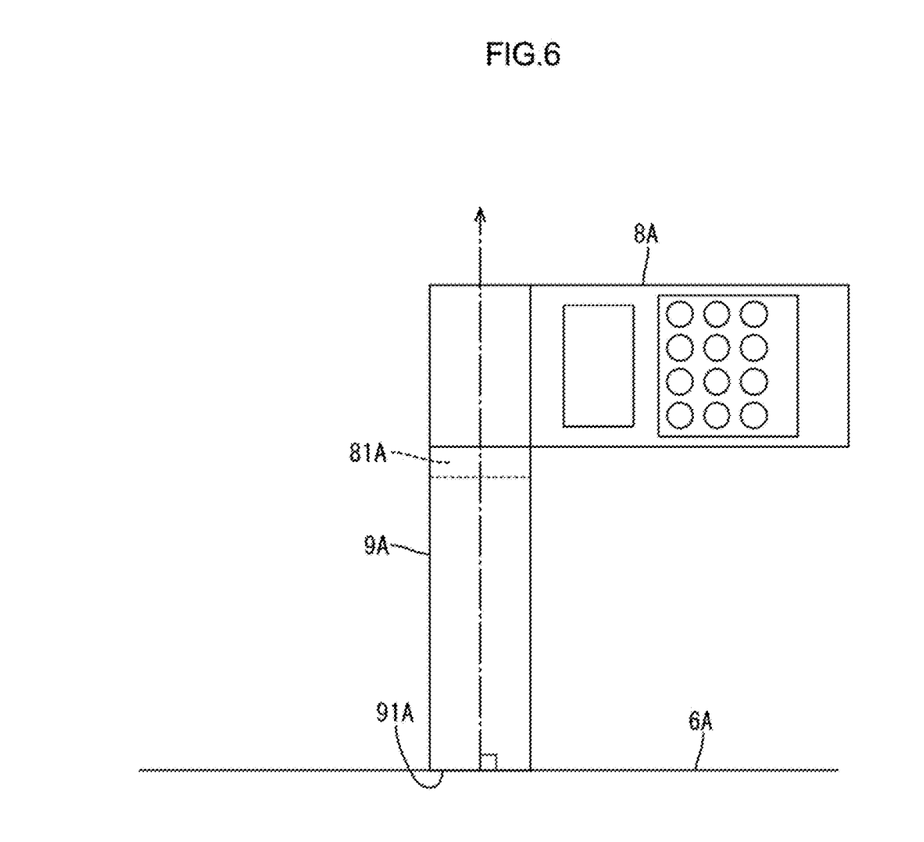
FIG. 6 is a plan view typically illustrating a liquid crystal panel where luminance is measured.

FIG. 6 is a plan view typically illustrating the liquid crystal panel 6A where luminance is measured. As illustrated in FIG. 6, luminance in a screen middle portion of the liquid crystal panel 6A was measured by a luminance meter ("BM-9AC (display part)", "BM-9A20D (receiving part)" made by TOPCON TECHNOHOUSE CORPORATION) 8A. The luminance meter 8A includes a measurement part 81A, and a cylindrical adaptor 9A is mounted on the measurement part 81A. An end portion 91A of the adaptor 9A is put on the screen middle portion vertically and the luminance is measured.

Comparative Examples 1, 2

In Comparative Example 1, a light source device 1X includes a silicone film described below instead of the fluorine-based coating film 21A and has a similar configuration to that of the light source device 1A other than the silicone film. In Comparative Example 2, a light source device 1Y includes no fluorine-based coating film 21A and other configuration is similar to that of the light source device 1A. The luminance degradation test was carried out for the light source devices 1X, 1Y, and 1A under the same conditions as the light source device 1A of the first embodiment. The light source devices 1A, 1X, 1Y are supplied with nitrogen gas from a same supply part 5A (nitrogen cylinder) through respective rubber hoses. The pressure of discharged gas from each of the light source devices 1X and 1Y is adjusted with using the pressure adjustment valve 70A so that the pressure within each of the light source device 1X and the light source device 1Y is adjusted to 300 hPa (atmospheric pressure+300 hPa).

(Silicone Film of Comparative Example 1)

Silicone varnish on the market ("FC-111" made by Fine Chemical Japan Co., LTD.) is coated on a surface of the LED package of the light source device 1A (the same part as that of the first embodiment) and the object was dried and a silicone film having thickness of 10 μm was formed.

Figure 7:
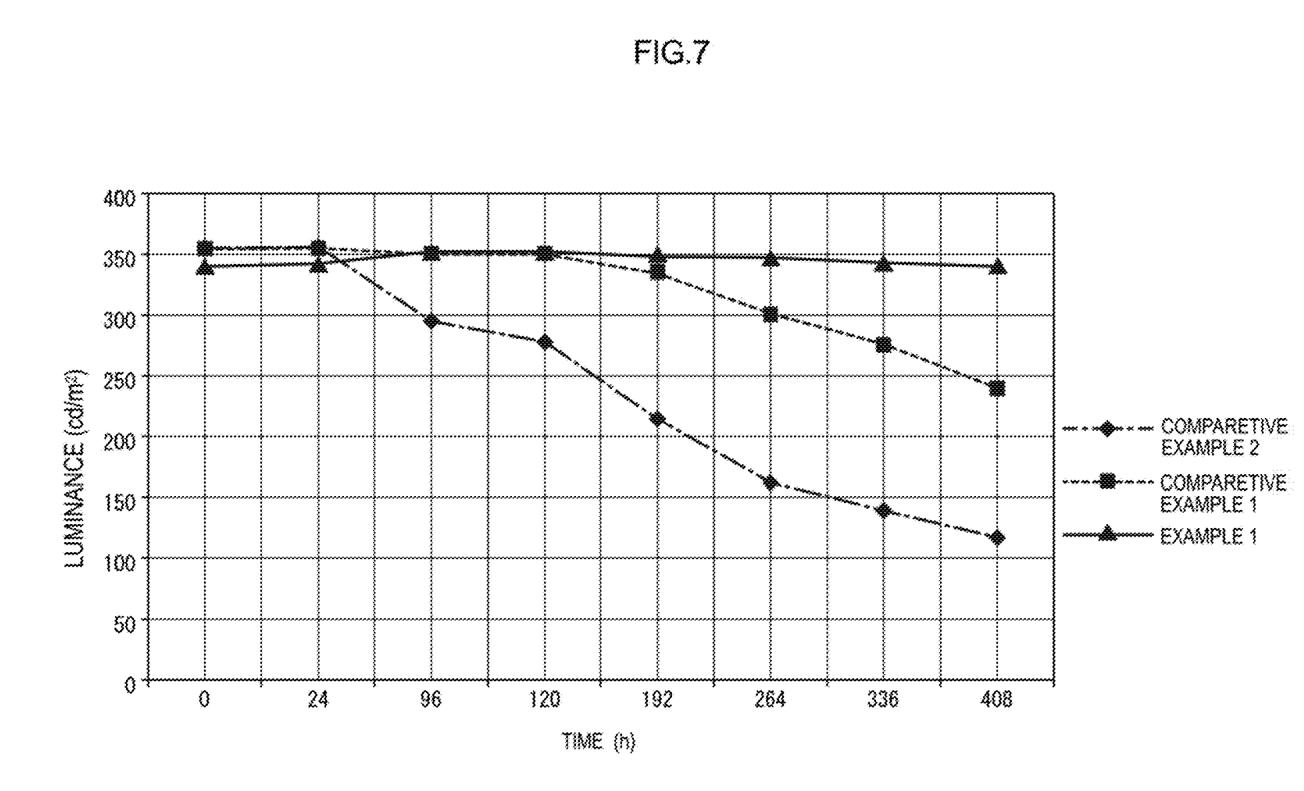
FIG. 7 illustrates graphs showing luminance measurement results of respective light source devices of Example 1, Comparative Example 1, and Comparative Example 2.

Luminance measurement results of the light source device 1A, the light source device 1X, and the light source device 1Y are illustrated by graphs in FIG. 7. In FIG. 7, a lateral axis of the graphs represents time (h) and a vertical axis of the graphs represents luminance ($cd/m^2$). As illustrated in FIG. 7, in the light source device 1A including the LED packages 22A having the fluorine-based coating film 21A, luminance is less likely to be degraded for 408 hours after starting of the test (0 hour). In the light source device 1A of the first embodiment, the luminance at the starting of the test (0 hour) is 340 $cd/m^2$, the luminance after 24 hours is 342 $cd/m^2$, the luminance after 96 hours is 352 $cd/m^2$, the luminance after 120 hours is 352 $cd/m^2$, the luminance after 192 hours is 348 $cd/m^2$, the luminance after 264 hours is 347 $cd/m^2$, the luminance after 336 hours is 343 $cd/m^2$, and the luminance after 408 hours is 340 $cd/m^2$.

In the light source device 1X of Comparative Example 1 including the LED packages having the silicone film, the luminance started to be degraded gradually after 192 hours from the starting of the test and the luminance was degraded with approximately 32% after 408 hours. In the light source device 1X of Comparative Example 1, the luminance at the starting of the test (0 hour) is 354 $cd/m^2$, the luminance after 24 hours is 355 $cd/m^2$, the luminance after 96 hours is 350 $cd/m^2$, the luminance after 120 hours is 350 $cd/m^2$, the luminance after 192 hours is 334 $cd/m^2$, the luminance after 264 hours is 301 $cd/m^2$, the luminance after 336 hours is 276 $cd/m^2$, and the luminance after 408 hours is 240 $cd/m^2$.

In the light source device 1Y of Comparative Example 2 including the LED packages having no coating film, the luminance was degraded with approximately 17% after 96 hours from the starting of the test. In the light source device 1Y of Comparative Example 2, the luminance was continuously degraded as the time passed and the luminance was degraded with approximately 67% after 408 hours. In the light source device 1Y of Comparative Example 2, the luminance at the starting of the test (0 hour) is 355 $cd/m^2$, the luminance after 24 hours is 356 $cd/m^2$, the luminance after 96 hours is 295 $cd/m^2$, the luminance after 120 hours is 278 $cd/m^2$, the luminance after 192 hours is 215 $cd/m^2$, the luminance after 264 hours is 162 $cd/m^2$, the luminance after 336 hours is 139 $cd/m^2$, and the luminance after 408 hours is 117 $cd/m^2$.

[Check of Blackening of LED Element]

Figure 8:
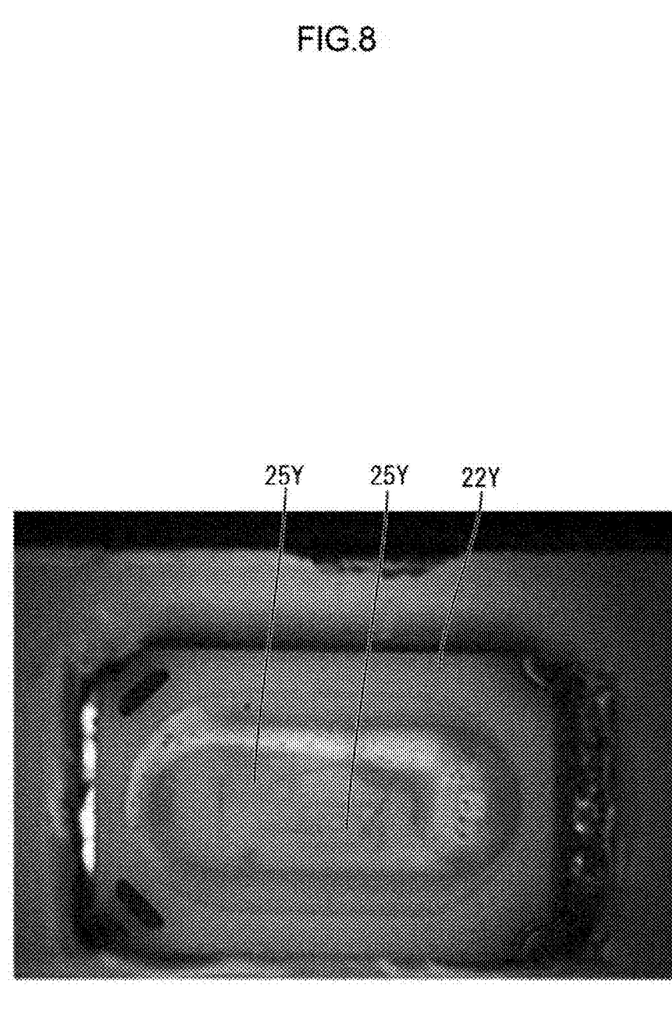
FIG. 8 is a photograph taken from a light exit surface side and showing a LED package (without a coating film) before staring of a test.
Figure 9:
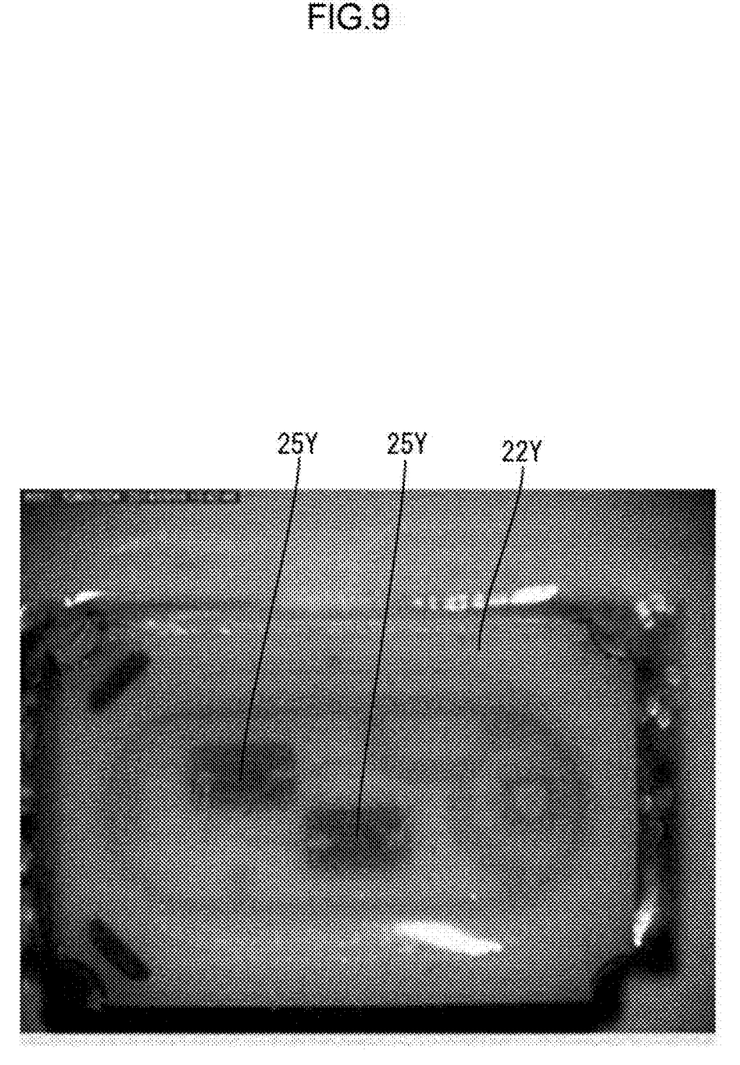
FIG. 9 is a photograph taken from the light exit surface side and showing the LED package (without the coating film) after 408 hours passed from starting of the test.

In the light source device 1Y of Comparative Example 2, the light source unit is removed from the light source device 1Y after the above luminance degradation test (after 408 hours from the starting of the test), and the condition of the LED element of the LED package was checked. FIG. 8 is a photograph of the LED package (without coating film) 22Y taken from the light exit surface side before starting of the test. FIG. 9 is a photograph of the LED package (without coating film) 22Y taken from the light exit surface side after 408 hours from starting of the test. As illustrated in FIG. 8, before starting of the test, a surface (a light emitting surface) of the LED element 25Y included in the LED package 22Y is not blackened. After 408 hours from the starting of the test, it was confirmed that a surface (a light emitting surface) of the LED element 25Y included in the LED package 22Y is changed in color to black (blackened).

Figure 10:
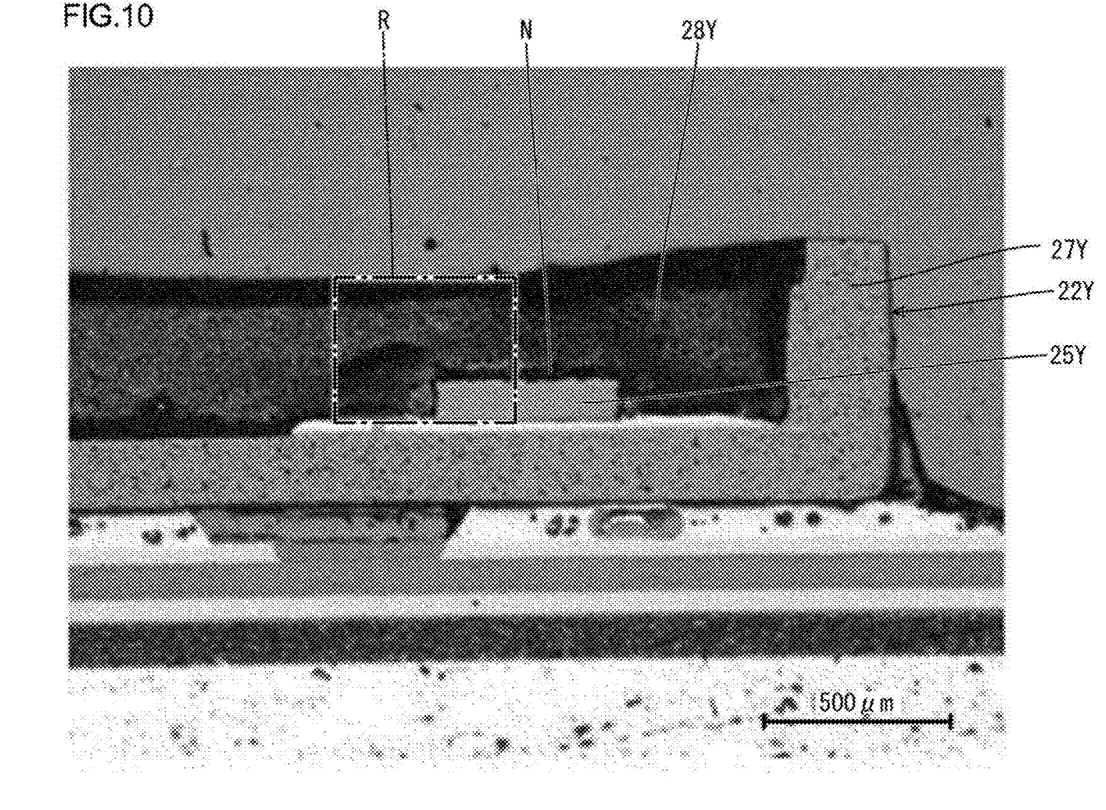
FIG. 10 is a photograph showing a cross section of the LED package including an LED element having a blackened surface.

The LED package 22Y including the LED element 25Y that is blackened after the luminance degradation test (after 408 hours from the starting of the test) was cross cut with ion milling and a cross section of the LED package 22Y was observed by an optical microscope. FIG. 10 is a photograph of the cross section of the LED package 22Y including the LED element 25Y having the blackened surface. As illustrated in FIG. 10, it was confirmed that a black layer N is formed on an upper surface (a light emitting surface) of the LED element 25Y. It was confirmed that the black layer N is formed only on the upper surface (the light emitting surface) of the LED element 25Y.

[Analysis of Black Layer of LED Element]

Figure 11:
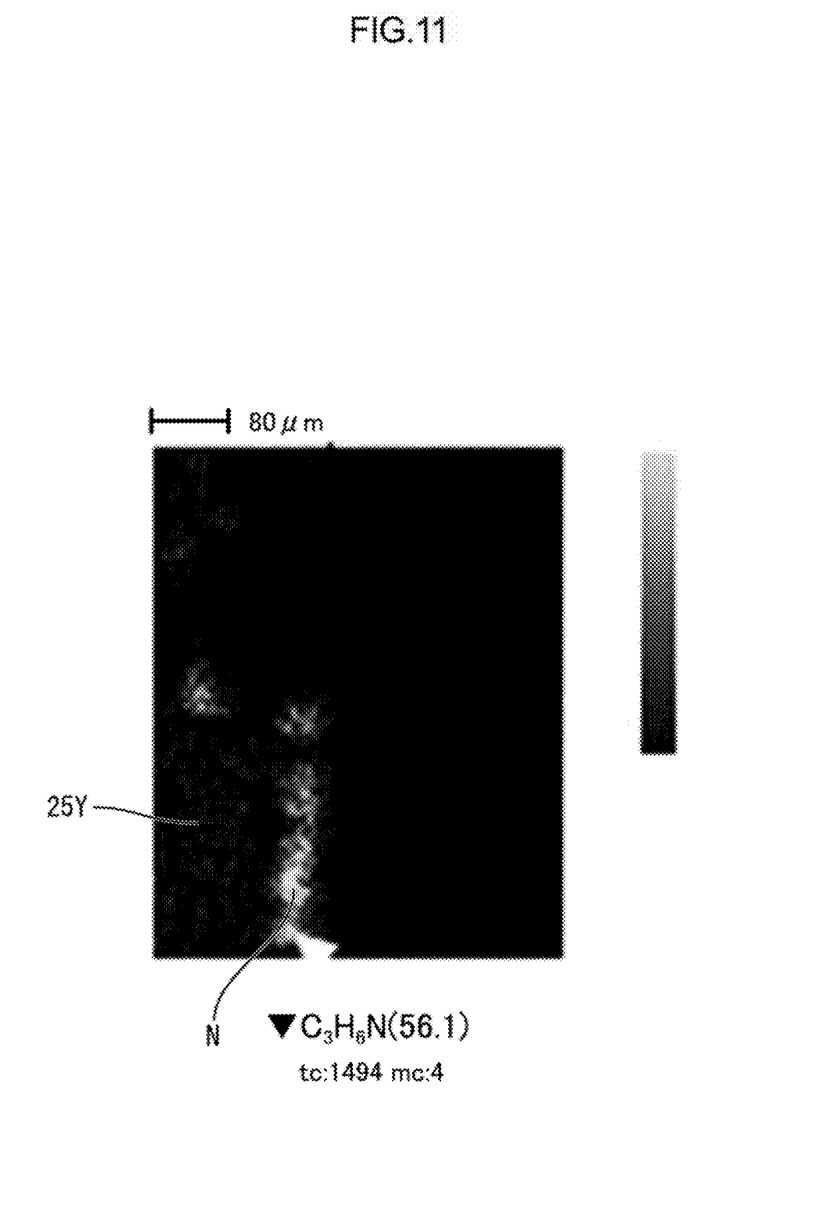
FIG. 11 illustrates an analysis result regarding a black layer formed on the LED element made with TOF-SIMS.

The black layer N formed on the LED element 25Y of the LED package 22Y illustrated in FIG. 10 was analyzed (mapping analysis) with TOF-SIMS (Time-of-Flight Secondary Mass Spectrometry method). The analysis result (positive ion mass image) is illustrated in FIG. 11. The analysis result image illustrated in FIG. 11 corresponds with an area R surrounded by a dotted line in FIG. 10. The analysis result image illustrated in FIG. 11 corresponds with the area R that is rotated clockwise at 90 degrees. A right side in FIG. 11 corresponds with an upper side in FIG. 10 and an upper side in FIG. 11 corresponds with a left side in FIG. 10.

As illustrated in FIG. 11 it was confirmed that the black layer N on the surface of the LED element 25Y is made of a substance ($C_3H_6N$) containing nitrogen atoms and carbon atoms. It is assumed that the black layer N is formed as follows. If the LED package 22Y is lighted on (energized) in nitrogen atmosphere, nitrogen gas in the atmosphere passes through the sealing resin 28Y (for example, porous silicone) of the LED package 22Y or passes through a quite small gap between the sealing resin 28Y and the peripheral wall portion 27Y. Thus, nitrogen gas reaches the surface (the light emitting surface) of the LED element 25Y and receives chemical action and turned to be black material.

If the LED package 22Y including the black layer N is energized in the atmosphere (for example, for fifteen minutes), the black layer N is disappeared and the luminance of the LED package 22Y (the LED element 25Y) is recovered to that before the black layer N is formed. Namely, the black layer N is formed on the surface of the LED element 25Y in a reversibly reactive way.

Other Embodiments

The present invention is not limited to the embodiment described above with reference to the drawings and the following embodiments may be included in the technical filed of the present invention.

(1) In the light source device 1, 1A, nitrogen gas is supplied from the outside of the casing 4 into the container 3 of the casing 4 with using the supply part 5, 5A including the nitrogen cylinder (so-called a flow type pressurized explosion-proof mechanism). However, the present technology is not necessarily limited thereto but may be configured such that nitrogen gas is sealed in the casing (container) of the light source device (so-called a sealed type explosion-proof mechanism).

(2) In the light source device of the present technology, the phosphors may be or may not be included in the sealing resin of the LED package.

(3) The LED package may be a top surface light emitting type or may be a side surface light emitting type.

(4) The light source device may include one LED package or may include two or more LED packages.

(5) Each of the LED packages included in the light source device may preferably have the fluorine-based coating film. However, certain one or ones of the LED packages may have the fluorine-based coating film.

The invention claimed is:

1. A light source device comprising:
   a LED package including
      a LED element,
      a base board on which the LED element is mounted,
      a peripheral wall portion surrounding the LED element and extending from the base board,
      sealing resin disposed in an inner space within the peripheral wall portion such that the LED element is sealed with the sealing resin, and
      a light exit surface that is a surface of the sealing resin surrounded by the peripheral wall portion, the light exit surface through which light from the LED element is exited outside the sealing resin,
   a container where the LED package is arranged and that is filled with nitrogen gas; and
   a fluorine-based coating film applied on a surface of the LED package and covering the light exit surface, wherein
   the LED element includes a gallium nitride base semiconductor,
   the fluorine-based coating film is made of coating agent comprising a fluorine-based copolymer that is obtained by random polymerization of a monomer composition containing methacrylic acid ester represented by a following general formula (1) in 49% by mass or more and 74% by mass or less, alkyl(meth)acrylate represented by a following general formula (2) in 16% by mass or more and 31% by mass or less, and fluorine-containing monomer represented by a following general formula (3) in 1% by mass or more and 33% by mass or less, and a solvent including one or more selected from hydrofluorocarbon with a carbon number of 4 to 8 and hydrofluoroether with a carbon number of 4 to 8, the fluorine-based copolymer having the number-average molecular weight in the range of 20,000 to 100,000:

(1)

wherein, in formula (1),

$R_1$ is a linear or branched chain alkyl group with a carbon number of 1 to 3;

(2)

wherein, in formula (2), $R_2$ is hydrogen or a methyl group, and $R_3$ is a linear or branched chain alkyl group with a carbon number of 4 to 8;

(3)

wherein, in formula (3), $R_4$ is hydrogen or methyl group, and n represents an integral number of 4 to 6.

2. The light source device according to claim 1, further comprising a transmissive member that is disposed in a wall surface of the container and through which light from the LED package is passed from the container to outside.

3. The light source device according to claim 2, wherein the transmissive member is a display screen that uses light from the LED package.

4. The light source device according to claim 1, wherein the fluorine-based coating film has thickness of 1 μm or more.

5. The light source device according to claim 1, wherein
   the LED package includes phosphors that are dispersed in the sealing resin and absorb light from the LED element and emits light having a wavelength different from a wavelength of the light from the LED element.

6. The light source device according to claim 1, further comprising a supply part supplying nitrogen gas into the container.

* * * * *